United States Patent [19]

Little

[11] Patent Number: 5,282,174

[45] Date of Patent: Jan. 25, 1994

[54] DUAL-PORT MEMORY WITH READ AND READ/WRITE PORTS

[75] Inventor: Trevor E. Little, Emmaus, Pa.

[73] Assignee: AT&T Bell Laboratories, Murray Hill, N.J.

[21] Appl. No.: 829,105

[22] Filed: Jan. 31, 1992

[51] Int. Cl.$^5$ ................................................ G11C 8/00
[52] U.S. Cl. ............................ 365/230.05; 365/189.04
[58] Field of Search ...................... 365/230.05, 189.04, 365/189.09, 230.06

[56] References Cited

U.S. PATENT DOCUMENTS 5,016,214  5/1991  Laymoun ........................ 365/230.05
5,036,491  7/1991  Yamaguchi ..................... 365/189.04

*Primary Examiner*—Eugene R. LaRoche
*Assistant Examiner*—A. Zarabian
*Attorney, Agent, or Firm*—James H. Fox

[57] ABSTRACT

A dual-port memory is accessed via a fast read port through p-channel access transistors and via a slow read/write port through n-channel access transistors. To reduce the disturbances resulting from a read operation through the read/write port, the row-line voltage applied to the gates of the n-channel access transistors is reduced to a value (e.g., 3 volts) below the value used for a write operation (e.g., 5 volts). In this manner, the lowered conductance of the n-channel access transistors during a read operation minimizes the effects of the pre-charged column conductors on the memory cell. Problems that could occur with a simultaneous read from the fast port, among others, are reduced.

10 Claims, 2 Drawing Sheets

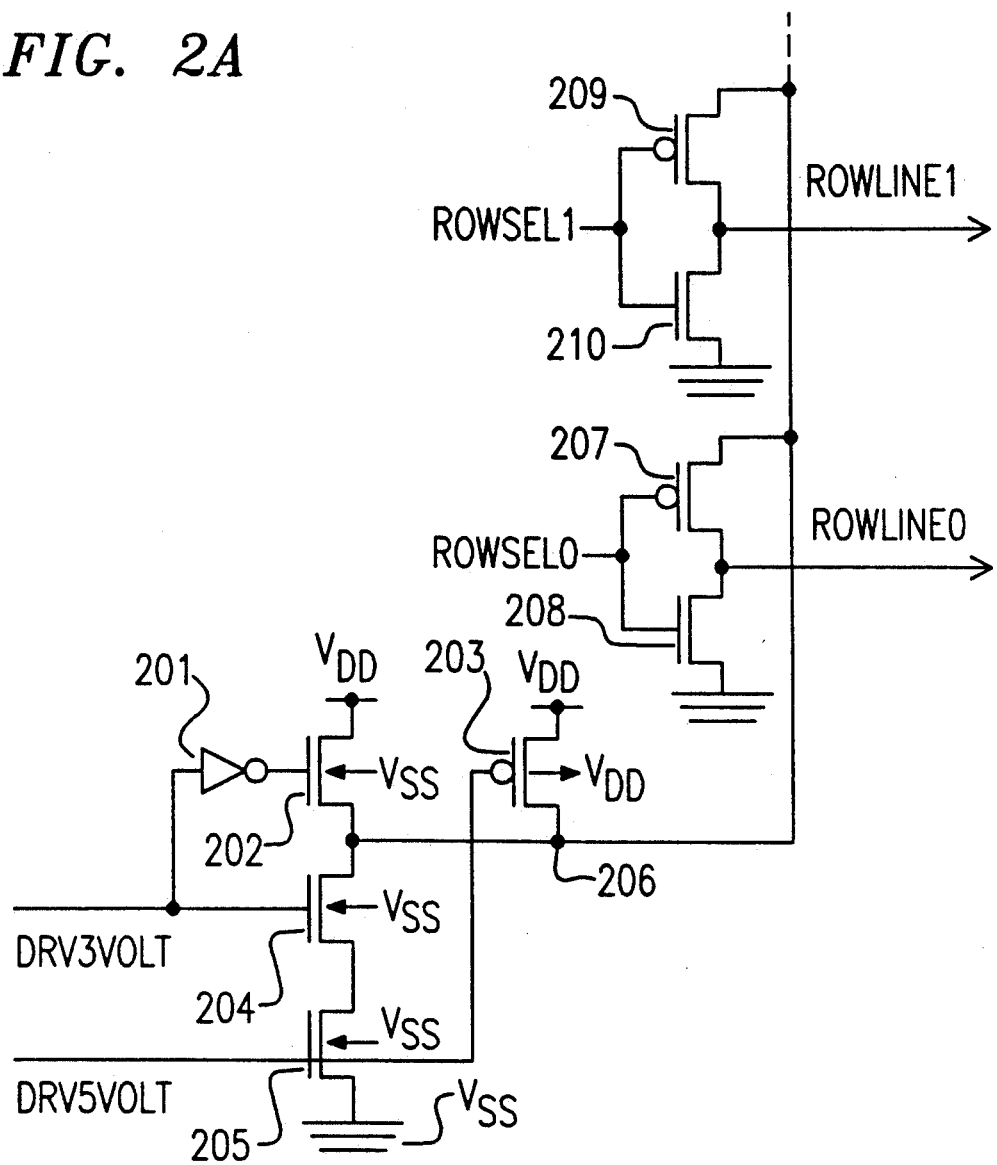

DUAL-PORT MEMORY WITH READ AND READ/WRITE PORTS

BACKGROUND OF THE INVENTION

1. Field of the Invention

The present invention relates to an integrated circuit having a dual-port memory.

2. Description of the Prior Art

A dual-port memory allows access to a memory cell to perform a read or a write operation from two functionally independent ports. One form of dual-port memory used in computer graphics applications includes "slow" and "fast" ports. The "slow" port allows both reading information from, and writing information to, the memory cell, and hence is also referred to as a "read/write" port. The "fast" port allows only reading information from the memory cell, and hence is also referred to as a "read-only" port. These speed designations are relative, and in one present-day integrated circuit technology, the cycle times for these operations are 100 nanoseconds and 7 nanoseconds, respectively. Furthermore, increases in speed will be achieved in future generations of technology. This type of dual-port memory is useful in graphics-display type applications that require a read/write port for interaction with a microprocessor or other device that supplies information to be displayed. The read-only port supplies data to a digital-to-analog converter for display on a video screen.

A problem in implementing a dual port memory having a fast read-only port and a slow read/write port concerns disturbances that could degrade a fast read operation. One type of disturbance between the ports, and one type of solution, is shown in U.S. Pat. No. 4,905,189. However, the solution provided therein requires extra transistors in the cell to isolate disturbances, which are said to be between a write operation and a simultaneous read operation. Also, both ports communicate to the cell through n-channel access devices, which causes added complexity to the cell layout when the two row-line conductors are located adjacent to each other. The cell layout area is typically increased as a result. It would therefore be desirable to obtain a dual-port memory that minimizes disturbances between the ports while allowing for a compact cell layout and a reduced number of devices.

SUMMARY OF THE INVENTION

I have invented a dual-port memory cell having a read port and a read/write port. A memory cell is accessed through the read port, typically at relatively high speed, through one or more transistors of a given conductivity type, typically p-channel. The cell is accessed through the read/write port, typically at a relatively slower speed, through one or more transistors of the opposite conductivity type, typically n-channel. The row-line voltage applied to the gates of the one or more access transistors of the read/write port varies depending upon whether a read or a write operation is being performed. During a write operation, this gate voltage is relatively high, typically the full power supply ($V_{DD}$) level. This allows for the internal state of the cell to be modified by the write circuitry. During a read operation, this gate voltage is relatively lower, typically in the range of from 0.32 to 0.8 of the power supply level. This relatively lower gate voltage reduces the conductance of the one or more n-channel access transistors, thereby reducing internal cell node disturbances, including those resulting form a simultaneous read through the read port and the read/write port.

BRIEF DESCRIPTION OF THE DRAWINGS

FIG. 2A shows an illustrative circuit for generating high level and low level row-line voltages, whereas;

FIG. 2B shows control signals for this circuit and the resulting output voltages.

DETAILED DESCRIPTION

Figure 1:
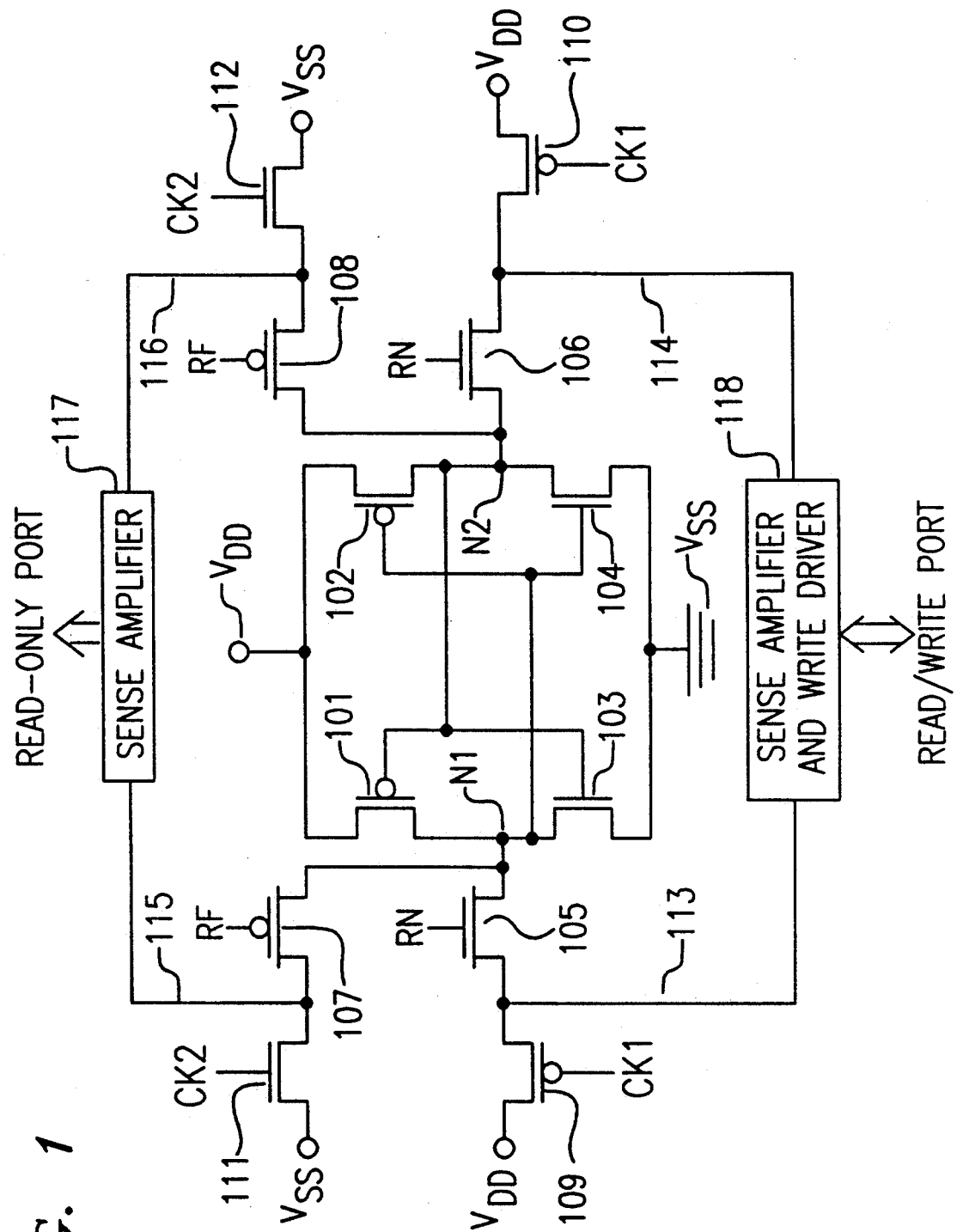
FIG. 1 shows an illustrative embodiment of the inventive dual-port memory utilizing a pair of n-channel access transistors and a pair of p-channel access transistors.

The following detailed description relates to a dual-port memory that utilizes a multi-level row-line voltage on at least one access transistor. Referring to FIG. 1, an illustrative embodiment of the inventive memory is shown. As will be understood by persons of skill in the art, such a memory cell is duplicated typically thousands, or even millions, of times in a typical integrated circuit. The individual memory cells are arrayed in rows and columns, and may be accessed according to row and column decoding techniques known in the art. The memory cell comprises p-channel storage transistors 101, 102 and n-channel storage transistors 103, 104 configured as a cross-coupled bistable flip-flop that is well known in the static memory design art. One side of the memory cell is accessed via node N1, whereas the other side is accessed via node N2. The read port communicates to the memory cell through the p-channel access transistors 107, 108 by means of column conductors 115, 116, respectively. This port typically performs only a read operation, and hence is often referred to as the "read-only" port by workers in the art, although a write operation through this port is in no way excluded by the inventive technique. This port is alternatively referred to as the "fast" port by workers in the art. The read/write port, also referred to as the "slow" port by workers in the art, communicates to the memory cell through the n-channel access transistors 105, 106 by means of column conductors 113, 114, respectively.

In operation, the column conductors 113, 114 are precharged high ($V_{DD}$) by precharge transistors 109, 110 respectively, under the control of a first clock signal (CK1). The column conductors 115, 116 are precharged low ($V_{SS}$) by precharge transistors 111, 112, respectively, under the control of a second clock signal (CK2). In order to perform a read operation through the read port, a low voltage ($V_{SS}$) is applied to the gates of access transistors 107, 108 by the row conductor RF. This allows these p-channel transistors to conduct the voltages stored on nodes N1 and N2 to the sense amplifier 117 via the column conductors 115, 116. To perform a write operation through the read/write port, a high voltage ($V_{DD}$) is applied to the gates of access transistors 105, 106 by the row conductor RN. This allows write voltages, generated by the write driver 118, to be conducted through these n-channel transistors to nodes N1 and N2. For example, if a logic "1" is to be stored in the memory cell, then the write driver 118 places a high voltage on node N1 and a low voltage on node N2. Conversely, a logic "0" to be stored results in a low voltage on N1 and a high voltage on N2. These voltages are stored by the aforementioned storage transistors 101–104 during subsequent read operations (through either port), until the next write operation is performed.

However, when performing simultaneous read operations through the read and read/write ports, a potential interference problem arises, as follows: The bit-lines (115, 116) for the read port are initially at $V_{SS}$ (0 volts), and when the row-line (RF) is turned on (to 0 volts) one of these bit-lines is driven towards $V_{DD}$ (5 volts) by the memory cell transistors. Also, when the row-line (RF) is on, the internal node of the cell that was at $V_{DD}$ (5 volts) is pulled down, typically by about 1 volt, by the precharged low voltage on these bit-lines (115, 116). The cell devices (101 . . . 104) are typically sized to ensure that this disturbance does not cause the cell state to change. However, simultaneously reading through the n-channel access transistors of the read/write port could potentially degrade the performance of reading through the read port. The critical time for inter-port disturbance occurs when the row-line (RN) on the n-channel access transistor (105, 106) of the read/write port is turned on (5 volts) and both bit-lines (113, 114) are initially at $V_{DD}$ (5 volts). In this case the internal node of the cell (e.g., N1) that was at 0 volts is pulled up by about 0.8 volts. This disturbance reduces the drive capability of the cross-coupled p-channel device (e.g., 102) that might then be accessed through the read-only port. Of secondary concern is the effect on cell stability of simultaneous read accesses on both ports combined with power supply noise.

To alleviate such problems, the inventive technique provides that when performing a read operation through the read/write port, the row-line voltage on the n-channel access transistors 105, 106 is raised to a value that is less than that used for a write operation through this port. For example, if a full 5-volt $V_{DD}$ value is used for a write operation, then a value of about 3 volts is suitable for a read operation. This lower value significantly reduces, by about a factor of 3, the conductance of access transistors 105, 106 during a read operation, so that any disturbances that would otherwise be introduced from the precharged column conductors 113, 114 are significantly reduced. Such disturbances could interfere with a read operation that was occurring simultaneously through the read port (i.e., through access transistors 107, 108). If severe enough, such disturbances could even change the state of the memory cell, thereby destroying the information stored there. In general, I recommend that the reduced row-line voltage during a read operation through the read/write port be in the range from 0.3 to 0.8 times the voltage during a write operation. When the read operation is completed the bit-lines will attain levels equal to the levels in the cell, and any disturbance will disappear.

After a read operation, the row-line voltage RN can then be increased so that a write operation may successfully drive the cell to a new state. In most cases, the write voltage will be $V_{DD}$, and hence the reduced voltage during a read operation will be less than $V_{DD}$. However, it is alternatively possible to use a boosted voltage (i.e., above $V_{DD}$) for the write operation, in which case the reduced voltage itself could be above $V_{DD}$. Although $V_{DD}=5$ volts in the illustrative case, in future integrated circuit designs a value of around 3 volts, or even less, may be used. The value of the row-line voltage during a read operation is also reduced accordingly.

A circuit suitable for generating the multi-level row-line voltages for the read/write access transistors is shown in FIG. 2A. The signals DRV3VOLT and DRV5VOLT control the generation of the desired voltage level, as indicated in the Table of FIG. 2B. When DRV3VOLT and DRV5VOLT are both high (logic "1"), then transistors 204 and 205 are both on, and transistors 202 and 203 are both off. Hence, the global row-line voltage level, at output node 206 for example, is low (0 volts). When DRV3VOLT is low, then transistor 204 is turned off and transistor 202 conducts, due to the inverter 201. Hence, the output node 206 is pulled up to $V_{DD}$ minus a threshold voltage drop by transistor 202. With a typical threshold voltage of about 2 volts in this configuration, node 206 is therefore pulled up to about 3 volts. However, if DRV5VOLT is low, then transistor 203 also conducts, and pulls node 206 up to the full 5 volt $V_{DD}$ level. This is because transistor 203 is a p-channel device, and when its gate is at 0 volts there is no significant voltage drop across it. Other types of circuits for generating the multi-level row-line voltages may be used. In particular, I recommend a lower voltage in the range of from about 2.0 to 3.0 volts when a 5 volt $V_{DD}$ power supply is used. This range typically provides adequate protection against disturbances during a read, while still allowing an adequate drive margin at the high level for writing into the cell.

These row-line voltage levels may be generated by a single circuit as shown, and distributed to the individual row-line conductors (ROWLINE0, ROWLINE1, etc.) through individual inverters (207–208; 209–210, etc.) under the control of row-select signals (ROWSEL1, ROWSEL2, etc.). In this manner, a "global" row-line voltage is generated for all the row-lines. Alternatively, multiple voltage-generating circuits may be used.

Although the illustrative embodiment has shown a dual-port memory cell that accesses both sides of the bistable memory cell (101 . . . 104), it is alternatively possible to access only a single side, as is taught by U.S. Pat. No. 4,660,177 co-assigned herewith. In that case, only a single n-channel access transistor (e.g., 105) and a single p-channel access transistor (e.g., 107) are used per cell, in order to access a single node (e.g., N1) of the cell. The other side of the memory cell (N2) is then left unconnected to external access devices. Hence, devices 106, 108, 110, 112 are omitted in that design. The sense amplifiers (117, 118) are then designed as single-ended types, instead of the differential types shown. However, the present invention may still be practiced in that case also, by reducing the row-line voltage during a read operation through the read/write port, and supplying a full voltage level substantially equal to the power supply voltage ($V_{DD}$) during a write operation through that port, as discussed above.

The illustrative embodiment has also shown p-channel access transistors for the read port, and n-channel access transistors for the read/write port. This is the optimum configuration with current technology transistors, given the higher gain of the n-channel types as compared to the p-channel types. However, it is possible that future technologies, or other design concerns, will make the opposite conductivity types preferable. In that case, the multi-level row-line signal would be applied to the p-channel access transistors that communicate with the read/write port, while the n-channel access transistors would communicate with the read port. A "high" voltage level applied to the p-channel transistor would then be more negative than the "lower" voltage level, as measured in magnitude referenced to the positive power supply voltage ($V_{DD}$).

I claim:

1. An integrated circuit comprising a memory cell that may be accessed through a read port and through a read/write port, wherein said memory cell is powered by a first power supply voltage and a second power supply voltage;
   characterized in that integrated circuit further comprises:
   at least one access transistor of a given conductivity that couples said read port to said memory cell;
   at least one access transistor of the opposite conductivity that couples said read/write port to said memory cell;
   and means for generating a multi-level row-line voltage that is applied to the control electrode of the access transistor that couples said read/write port to said memory cell, wherein a high voltage level is applied during a write operation, and a lower voltage level less than said second power supply level is applied during a read operation.

2. The integrated circuit of claim 1 wherein said lower voltage level is in the range of from 0.3 to 0.8 of said high voltage level.

3. The integrated circuit of claim 1 wherein said lower voltage level is a transistor threshold voltage drop below said high voltage level.

4. The integrated circuit of claim 1 wherein said access transistor of a given conductivity is a p-channel field effect transistor, said access transistor of the opposite conductivity is an n-channel field effect transistor, and said second power supply voltage (e.g., $V_{DD}$) is more positive than said first power supply voltage (e.g., $V_{SS}$).

5. An integrated circuit comprising a memory cell that may be accessed through a read port and through a read/write port, wherein said memory cell is powered by a first power supply voltage and a second power supply voltage;
   characterized in that integrated circuit further comprises:
   at least one access transistor of a given conductivity that couples said read port to said memory cell;
   at least one access transistor of the opposite conductivity that couples said read/write port to said memory cell;
   and means for generating a multi-level row-line voltage that is applied to the gate of the access transistor that couples said read/write port to said memory cell, wherein a high voltage level substantially equal to said second power supply voltage is applied during a write operation, and a lower voltage level is applied during a read operation, wherein said lower voltage level is in the range of from 0.3 to 0.8 of said high voltage level.

6. The integrated circuit of claim 5 wherein said access transistor of a given conductivity is a p-channel transistor, said access transistor of the opposite conductivity is an n-channel transistor, and said second power supply voltage (e.g., $V_{DD}$) is more positive than said first power supply voltage (e.g., $V_{SS}$).

7. An integrated circuit comprising a memory cell that may be accessed through a read port and through a read/write port, wherein said memory cell is powered by a first power supply voltage and a second power supply voltage;
   characterized in that integrated circuit further comprises:
   at least one access transistor of a given conductivity that couples said read port to said memory cell;
   at least one access transistor of the opposite conductivity that couples said read/write port to said memory cell;
   and means for generating a multi-level row-line voltage that is applied to the gate of the access transistor that couples said read/write port to said memory cell, wherein a high voltage level substantially equal to said second power supply voltage is applied during a write operation, and a lower voltage level is applied during a read operation, wherein said lower voltage level is a transistor threshold voltage drop below said high voltage level.

8. The integrated circuit of claim 7 wherein said access transistor of a given conductivity is a p-channel transistor, said access transistor of the opposite conductivity is an n-channel transistor, and said second power supply voltage (e.g., $V_{DD}$) is more positive than said first power supply voltage (e.g., $V_{SS}$).

9. The integrated circuit of claim 8 wherein said means for generating a multi-level row-line voltage comprises:
   first, second, and third n-channel transistors (202, 204, 205) having source and drain regions serially connected between a positive power supply voltage ($V_{DD}$) and a negative power supply voltage ($V_{SS}$), with an output node (206) formed at the connection of said first and second transistors;
   a p-channel transistor (203) having a source connected to said positive power supply voltage and a drain connected to said output node;
   an inverter (201) having an output connected to the gate of said first n-channel transistor;
   a first control signal line (DRV3VOLT) connected to the input of said inverter and to the gate of said second n-channel transistor; and
   a second control signal line (DRV5VOLT) connected to the gate of said third n-channel transistor and to the gate of said p-channel transistor.

10. The integrated circuit of claim 9 further comprising a multiplicity of complementary inverters (207-208, 209-210) connected to said output node (206) for distributing the output voltage at said output node to a multiplicity of row-line conductors (ROWLINE0, ROWLINE1).

* * * * *